March 22, 1955 E. EBERHARD ET AL 2,704,792

AMPLIFIER WITH ADJUSTABLE PEAK FREQUENCY RESPONSE

Filed June 28, 1950

INVENTORS
EVERETT EBERHARD
& RICHARD O. ENDRES
BY H. O. Newton
ATTORNEY

United States Patent Office 2,704,792

Patented Mar. 22, 1955

2,704,792

AMPLIFIER WITH ADJUSTABLE PEAK FREQUENCY RESPONSE

Everett Eberhard, Haddonfield, and Richard O. Endres, Moorestown, N. J., assignors to Radio Corporation of America, a corporation of Delaware Application June 28, 1950, Serial No. 170,926

1 Claim. (Cl. 179—171)

This invention relates generally to peaking amplifiers, and has for its primary object to provide a semi-conductor amplifier having a peak frequency response which may be adjusted over a wide frequency range.

At the present time, amplifiers of the semi-conductor type are well known. Such semi-conductor devices are usually called transistors. It is also well known that the response of a semi-conductor amplifier is reduced rather rapidly at frequencies above approximately 1 mc. (megacycles). Furthermore, the response above 10 mc. of the amplifier is usually too low for any practical use. It has accordingly been difficult heretofore to provide a semi-conductor amplifier with a flat pass band at frequencies substantially above 1 mc. Wide-band amplifiers which require a flat pass band find wide application, for example, in the television field. It is conventional practice to provide a so-called peaking amplifier which has a peaked high-frequency response to boost the high frequency response of the band-pass of a transmission channel. Thus, peaking amplifiers are frequently used in the video channel of a television receiver.

It is accordingly a further and important object of the present invention to provide a semi-conductor peaking amplifier having a peak frequency response which is adjustable over a fairly wide frequency range, thereby to provide an electrically tunable band pass amplifier which may be utilized to compensate for the normally drooping frequency response of a semi-conductor amplifier chain or to provide for varying the tuning of a selective receiving system electrically.

In accordance with the present invention, a semi-conductor amplifier is provided with an inductor connected in circuit with its base electrode. A semi-conductor amplifier conventionally includes a semi-conducting body provided with a base electrode, an emitter electrode and a collector electrode. The base electrode is in low-resistance contact with the semi-conducting body and usually is a large-area electrode. The collector and emitter electrodes are in rectifying contact with the semi-conducting body. They may be point contacts, line contacts or even large-area contacts provided they are in rectifying contact with the body. For normal operation as an amplifier a bias voltage in the reversed direction is applied between collector and base. If the semi-conducting body consists of an N type crystal such as a germanium crystal, the emitter should be positive with respect to the base while the collector should be negative with respect to the base. If a P type crystal is used, the potentials must be reversed.

The inductor of the amplifier of the present invention preferably is connected between base and ground. It has been found that the inductance of the inductor may be made to resonate with the equivalent capacitance of the semi-conductor amplifier, that is, with the capacitance which appears looking into the base electrode. The magnitude of this capacitance is adjustable by adjusting either the collector or the emitter bias voltage. Adjustment of the bias voltages in turn will adjust the currents, that is, the emitter and collector currents.

The novel features that are considered characteristic of this invention are set forth with particularity in the appended claim. The invention itself, however, both as to its organization and method of operation, as well as additional objects and advantages thereof, will best be understood from the following description when read in connection with the accompanying drawing, in which:

Figure 1:
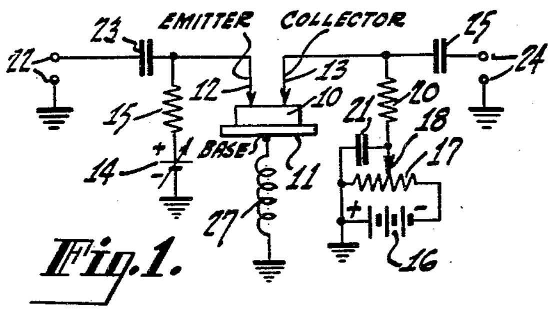
Figure 1 is a circuit diagram of a semi-conductor amplifier embodying the present invention.

Referring now to Figure 1, there is illustrated a peaking amplifier in accordance with the present invention including semi-conducting body 10. Body 10 may, for example, consist of germanium or silicon containing a small amount of impurity centers as is conventional for a transistor. The surface of body 10 may be polished and etched as is conventional. Base electrode 11, emitter electrode 12 and collector electrode 13 are in contact with body 10. As pointed out previously, base electrode 11 is in low-resistance, non-rectifying contact with body 10 while emitter electrode 12 and collector electrode 13 are in rectifying contact with the body. Base electrode 11 may, for example, be provided by soldering a suitable piece of brass or other conducting material to the semi-conducting body 10. Emitter electrode 12 and collector electrode 13 may, for example, consist of fine pointed wires of tungsten or Phosphor bronze.

In order to impress a bias voltage in the forward direction between emitter electrode 12 and base electrode 11, there may be provided battery 14 having its negative terminal grounded while its positive terminal is connected to emitter electrode 12 through resistor 15. Battery 14 may be adjustable as indicated. For the purpose of providing a bias voltage in the reverse direction between collector electrode 13 and base electrode 11 there may be provided battery 16 having its positive terminal grounded. Potentiometer resistor 17 is connected across battery 16 and a variable negative voltage may be derived from potentiometer 17 by variable tap 18 connected to collector electrode 13 through resistor 20. Capacitor 21 is connected between tap 18 and ground for bypassing signal frequency currents. An input signal to be amplified may be impressed on input terminals 22, one of which is grounded while the other one is coupled through coupling capacitor 23 to emitter electrode 12. The amplified output signal is developed across output load resistor 20 and may be obtained from output terminals 24, one of which is grounded while the other one is coupled through coupling capacitor 25 to collector electrode 13.

In accordance with the present invention, inductor 27 is connected between base electrode 11 and ground. It has been found that the peak frequency response of the amplifier of Figure 1 is determined by the inductance of inductor 27 and by the applied emitter and collector bias voltages. These voltages are adjustable by adjustment of battery 14 and by adjustment of tap 18 on potentiometer 17.

The following formula indicates why the power gain of the amplifier of Figure 1 is determined by the external base impedance. Thus the power gain P of the amplifier of Figure 1 is given by the following equation:

$$P=\frac{r_L r_m}{r_L(r_b+r_e)+r_c(r_b+r_e)-r_b r_m}\times\frac{r_m+r_b}{r_L+r_e+r_b}$$

wherein the first factor represents the voltage gain while the second factor is the actual current gain A. In the above equation $r_m$ is a constant of the transistor, $r_c$ is the equivalent collector resistance, $r_e$ is the equivalent emitter resistance, $r_L$ is the external load impedance, that is, resistor 20 and $r_b$ is the equivalent base impedance including the external base impedance, that is, inductor 27. The above equation may then be simplified as follows:

$$P=\frac{r_L r_m}{r_e(r_L+r_c)-Br_b}\times A$$

where $B=r_m-(r_L+r_c)$.

It will be apparent that under those conditions the power gain varies directly with $r_b$. The operating region which is of interest is where $Br_b$ is slightly smaller than $r_e(r_L+r_c)$. Under these conditions A, the actual current gain, is approximately unity. Thus, by increasing $r_b$ a high gain may be obtained. In other words, such a gain may be obtained when base inductor 27 resonates with the equivalent capacitance looking into the base electrode. This capacitance is due to a phase difference or lag between the emitter and collector currents. The phase shift is in such a direction as to create a capacitive effect looking into the base electrode.

Figure 3:
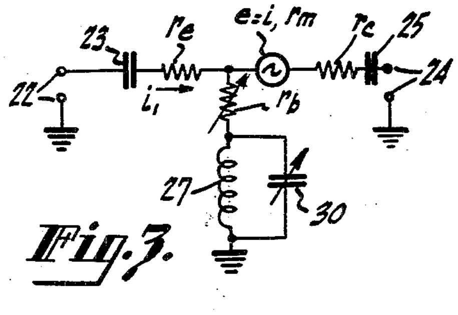
Figure 3 is an equivalent circuit diagram of the amplifier of Figure 1.

Referring now to Figure 3, there is illustrated an equivalent circuit of the amplifier of Figure 1. Inductor 27 is shunted by variable capacitor 30 which represents the capacitance looking into the base electrode 11. Resistors $r_e$ and $r_c$ (the equivalent emitter and collector resistances) are connected in series between input terminals 22 and output terminals 24. Resistor $r_b$ which has been indicated to be variable is connected between parallel resonant circuit 27, 30 and the junction point between resistors $r_e$ and $r_c$. Resistor $r_b$ indicates that the resistance looking into base electrode 11 will also vary with a variation of the capacitance of capacitor 30. A generator developing a voltage $e=ir_m$ is connected in series with resistor $r_c$, where $i$ indicates a current flowing in the direction shown by the arrow, while $r_m$ indicates a resistance.

Figure 2:
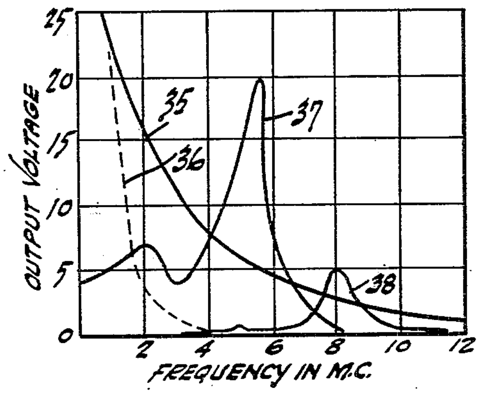
Figure 2 is a graph illustrating the output voltage of the amplifier of Figure 1 as a function of frequency under various operating conditions.

Curve 35 of Figure 2 shows the output voltage as a function of frequency for an amplifier of the type illustrated in Figure 1 with inductor 27 removed and the base terminal 11 grounded. The collector current was 2.4 ma. (milliampere) while the emitter current was 1.4 ma. The three curves 36, 37 and 38 each illustrate the output voltage of an amplifier of the type illustrated in Figure 1, wherein the inductor 27 has a value of 46 $\mu$h. (microhenries). The dashed curve illustrates the output voltage, as a function of frequency, with a collector current of 2.4 ma. and an emitter current of 1.4 ma. which are the same bias conditions under which the curve 35 was obtained. The bias conditions for the curve 37 were a collector current of 1.3 ma. and an emitter current of 0.23 ma. The bias conditions for the curve 38 were a collector current of 1 ma. and an emitter current of .015 ma. It is obvious from a comparison of the frequency at which each of the curves is peaked that the response of the amplifier is readily adjustable by the control of the bias currents. It will be readily understood that the emitter current varies with an adjustment of the collector voltage.

Curves 37 and 38 show that the peak frequency response of the amplifier of Figure 1 may be adjusted through about 3 mc. with a change in collector current of 0.3 ma. In particular, when the collector current increases, the equivalent base capacitance increases and the peak response of the amplifier is at a lower frequency.

Figure 4:
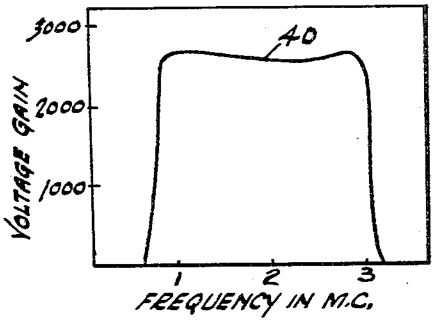
Figure 4 is a graph which illustrates the voltage gain as a function of frequency of a wide-band amplifier channel including the amplifier of Figure 1.

The amplifier of the present invention may be used as an electrically tunable band pass amplifier. In particular it may be utilized to compensate for the normally drooping frequency response of a transistor which is shown by curve 35. Curve 40 of Figure 4 illustrates a substantially flat response between 0.75 and 3 mc. which has been obtained with the amplifier of the invention. Curve 40 of Figure 4 was obtained with 5 conventional transistor amplifiers followed by a peaking amplifier in accordance with the invention. The first three amplifier stages were followed by conventional band pass filters to cut off frequencies below .75 mc. and above 3 mc. Thus, a substantially flat frequency response to a maximum frequency of three mc. may be obtained. It is to be understood that the emitter bias voltage may be adjusted instead of the collector bias voltage or that both bias voltages may be adjusted simultaneously.

What is claimed is:

An electrically tunable amplifier system having a frequency response peaked at a predetermined signal frequency and comprising a semi-conducting body, a base electrode, an emitter electrode, and a collector electrode in contact with said body, said device having a capacitive characteristic variable with applied bias, means connected between a junction point and said emitter and collector electrodes for applying a bias current in the forward direction between said emitter and base electrodes and for applying a bias current in the reverse direction between said collector and base electrodes, an inductor connected between said base electrode and said junction point, the capacitance of said device and the inductance of said inductor affording a circuit resonance at said predetermined signal frequency tunable by adjustment of said bias currents, means for impressing an input signal from a source external to said amplifier system between said emitter electrode and said junction point, means for deriving an output signal effectively between said collector electrode and said junction point, and means connected with said first means for adjusting one of said bias currents, thereby to adjust said circuit resonance.

References Cited in the file of this patent

UNITED STATES PATENTS

| | | |
|---|---|---|
| 1,869,536 | Black | Aug. 7, 1932 |
| 2,226,945 | Rocard | Dec. 31, 1940 |
| 2,261,619 | Foster | Nov. 4, 1941 |
| 2,310,910 | Rust et al. | Feb. 9, 1943 |
| 2,486,776 | Barney | Nov. 1, 1949 |
| 2,502,479 | Pearson et al. | Apr. 4, 1950 |
| 2,647,957 | Mallinckrodt | Aug. 4, 1953 |
| 2,659,773 | Barney | Nov. 17, 1953 |

OTHER REFERENCES

Rev. of Sci. Inst., August 1949, Reich article, pages 586–588.

Electronics, September 1948, pages 68–71.

Electronics, August 1949, Lehan article, pages 90–91.